US008139688B1

(12) United States Patent
Wu et al.

(10) Patent No.: US 8,139,688 B1
(45) Date of Patent: *Mar. 20, 2012

(54) DIFFERENTIAL RECEIVER WITH FREQUENCY OFFSET COMPENSATION

(75) Inventors: Songping Wu, Sunnyvale, CA (US); Hui-Ling Lou, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/893,926

(22) Filed: Sep. 29, 2010

Related U.S. Application Data

(63) Continuation of application No. 11/500,633, filed on Aug. 8, 2006, now Pat. No. 7,809,083.

(60) Provisional application No. 60/761,241, filed on Jan. 23, 2006.

(51) Int. Cl.
*H03D 3/22* (2006.01)

(52) U.S. Cl. ........ 375/329; 375/279; 375/280; 375/281; 375/282; 375/283; 375/284; 375/316; 375/322; 375/330; 375/331; 375/332; 375/339; 375/344; 375/362

(58) Field of Classification Search .......... 375/279–284, 375/316, 329–332, 339, 344, 362
See application file for complete search history.

(56) References Cited

U.S. PATENT DOCUMENTS

| | | | |
|---|---|---|---|
| 5,376,894 A | 12/1994 | Petranovich | |
| 5,432,819 A | 7/1995 | Mui | |
| 5,440,267 A | 8/1995 | Tsuda et al. | |
| 5,581,582 A | 12/1996 | Choi | |
| 5,625,652 A | 4/1997 | Petranovich | |
| 6,023,491 A * | 2/2000 | Saka et al. | 375/326 |
| 6,363,123 B1 | 3/2002 | Furukawa et al. | |
| 6,590,945 B1 * | 7/2003 | Brardjanian et al. | 375/340 |
| 6,678,012 B1 * | 1/2004 | Belotserkovsky | 348/731 |
| 6,778,613 B2 | 8/2004 | Avidor et al. | |
| 6,882,208 B1 | 4/2005 | Suissa et al. | |
| 6,975,691 B1 | 12/2005 | Shiraishi | |
| 7,224,666 B2 | 5/2007 | Gummadi et al. | |
| 7,305,053 B2 | 12/2007 | Van Houtum | |
| 7,392,031 B2 | 6/2008 | Van Houtum | |
| 7,477,707 B2 | 1/2009 | Kazi et al. | |
| 7,675,989 B2 | 3/2010 | Ahn et al. | |
| 2004/0240596 A1 | 12/2004 | Liu | |
| 2005/0085249 A1 | 4/2005 | Goldstein et al. | |
| 2005/0163274 A1 | 7/2005 | Ito | |
| 2005/0164639 A1 | 7/2005 | Suissa et al. | |
| 2006/0133527 A1 | 6/2006 | Yu et al. | |

OTHER PUBLICATIONS

M. Morelli et al., "Further Results in Carrier Frequency Estimation for Transmissions Over Flat Fading Channels", IEEE Communications Letters, vol. 2, No. 12, Dec. 1998, pp. 327-330.

O. Besson et al., "On Frequency Offset Estimation for Flat-Fading Channels", IEEE Communications Letters, vol. 5, No. 10, Oct. 2001, pp. 402-404.

(Continued)

*Primary Examiner* — Chieh M Fan
*Assistant Examiner* — Sophia Vlahos

(57) ABSTRACT

A differential receiver which provides for estimation and tracking of frequency offset, together with compensation for the frequency offset. Estimation and tracking of the frequency offset is undertaken in the phase domain, which reduces computational complexity and allows frequency offset estimation and tracking to be accomplished by sharing already-existing components in the receiver. Compensation for the frequency offset can be performed either in the time domain, before differential detection, or in the phase domain, after demodulation, or can be made programmably selectable, for flexibility.

18 Claims, 9 Drawing Sheets

OTHER PUBLICATIONS

"Information technology—Telecommunications and information exchange between systems—Local and metropolitan area networks—Specific requirements—Part 11: Wireless LAN Medium Access Control (MAC) and Physical Layer (PHY) specifications" International Standard ISO/IEC 8802-11, ANSI/IEEE Std. 802.11, 1999.

* cited by examiner

DIFFERENTIAL RECEIVER WITH FREQUENCY OFFSET COMPENSATION

CROSS-REFERENCE TO RELATED APPLICATION

The present application is a continuation of non-provisional application Ser. No. 11/500,633, filed Aug. 8, 2006, entitled "DIFFERENTIAL RECEIVER WITH FREQUENCY OFFSET COMPENSATION," now U.S. Pat. No. 7,809,083, issued Oct. 5, 2010, which claims the benefit of U.S. Provisional Patent Application No. 60/761,241, filed Jan. 23, 2006, the entire specifications of which are hereby incorporated by reference in their entireties for all purposes, except for those sections, if any, that are inconsistent with this specification

BACKGROUND OF THE INVENTION

1. Field of the Invention

The present invention relates to a differential receiver which provides for estimation and/or tracking of frequency offset, together with compensation for the frequency offset.

2. Description of the Related Art

Differential receivers are popular in a variety of circumstances, such as in wireless local area networks (WLAN, for example, IEEE 802.11) or personal area networks (for example, Bluetooth®). A typical architecture employs differential quadrature phase shift keying (DQPSK). These receivers are attractive because of their low cost coupled with good performance and acceptable data transmission rates in the presence of noise.

Such communication systems suffer, however, from significant performance loss introduced by frequency offset, since it is difficult to accurately extract the data payload from a received signal in the presence of frequency offset. Frequency offset is common, given the low tolerances of the receivers and transmitters, and is also common in the presence of fading channels. Therefore, estimation and/or tracking of frequency offset, together with compensation therefor, is important to sustain adequate performance.

Conventional known systems estimate frequency offset either by calculating auto-correlation between a known pilot and a received signal, or by evaluating the cross-correlation between two identical symbols, such as symbols that might be found in the preamble of a data transmission. A conventional arrangement is shown in FIG. 1.

FIG. 1 illustrates one example of a conventional differential PSK (phase shift keying) receiver in the presence of an additive white Gaussian noise (AWGN) channel. A radio frequency signal is received by antenna1 11, with the radio frequency signal encoding a digital data payload. RF front end 12 and RF-to-BB (baseband) converter 14 down-convert the radio frequency signal to a baseband signal, and further extract an in-phase component (denoted as "i") and a quadrature phase component (denoted as "q") that are respectively sampled by a pair of A/D converters 15. The in-phase signal and the quadrature signal are respectively filtered by low-pass filters 16 which eliminate adjacent channel interference and thereafter provide the signals $I_{BB}(n)$ and $Q_{BB}(n)$ to differential detector 17. Differential detector 17 applies differential detection to the filtered signals to obtain a correspondingly demodulated PSK signal which is potentially corrupted by frequency offsets. Compensator 19 applies a frequency offset compensation based on an output of frequency offset estimation and tracking block 20 (which is described below), in order to reduce or remove the frequency offset. Phase extractor 21 extracts phase from the compensated signal, demodulator 22 demodulates the output from phase extractor 21, and decoder and bit slicer 24 decodes the demodulated output and provides the digital data payload at 25.

Reverting to differential detector 17, the demodulated PSK signal is often modeled mathematically by the complex-valued signal of the following equation:

$$y(n) = y_{di}(n) + j^* y_{dq}(n) = ae^{j\psi} \quad \text{(Equation 1)}$$

where y(n) is the nth symbol, $y_{di}$ and $y_{dq}$ are the in-phase and quadrature phase demodulated PSK signals, respectively, j is the imaginary coordinate for the complex value, and a and P represent the amplitude and phase of the received signal, respectively. Based on this mathematical notation, frequency offset estimation and tracking block 20 provides an estimate of the frequency offset by implementing an auto-correlation on the received signal according to the following equation:

$$2\pi \Delta f T = \hat{\psi} = \text{angle}\left(\frac{1}{N}\sum_{n=0}^{N-1} y(n) y^*(n-L)\right) \quad \text{(Equation 2)}$$

where $\Delta f$ is the frequency offset, T is time, $\hat{\psi}$ is the estimate of phase, y(n) is the demodulated PSK signal from differential detector 17 and y*(n) is the complex conjugate thereof, and N and L are the block length of one training block and the distance therebetween. The relation between N and L are shown in FIG. 2, which shows that a typical RF transmission includes a preamble that prefaces the data payload, wherein the preamble includes N training signals y(n) that repeat at block distances separated by L symbols. Thus, $$y(n) = y(n-L) \quad \text{(Equation 3)}$$

for n=0, . . . , N−1, which means that the training signals need to be repeated in order to obtain the frequency offset estimate.

As shown above, in conventional receivers, the estimation and tracking of frequency offset is computationally expensive. Specifically, quite a few number of symbols N are needed to estimate the frequency offset. Furthermore, the correlation of Equation 2 requires many complex-valued multiplications and complex-valued additions, especially when the number of samples N is large. Thus, in terms of complexity, chip area and/or power consumption, the conventional technique for estimation and tracking of frequency offset has its disadvantages.

Moreover, the range over which frequency offset can be estimated is limited by the block distance L: As the block distance L increases, the estimation range decreases. Since a large number of symbols N are needed, the value of L tends to increase, and conventional systems tend to exhibit a limited estimation range for estimation of frequency offset.

SUMMARY OF THE INVENTION

The above shortcomings and other issues in conventional receivers are addressed by the present invention, in which estimation and/or tracking of frequency offset is undertaken in the phase domain.

Because estimation and/or tracking of frequency offset occurs in the phase domain, computational complexity, chip area and power consumption are all reduced significantly, since the calculation can be performed with real-valued additions. Thus, it is ordinarily possible to dispense with the complex-valued multiplications and complex-valued additions of conventional systems. Moreover, an initial estimate of frequency offset can be acquired after only a few pilot symbols, which results in a wider estimation range for frequency offset. After the initial estimate of frequency offset is acquired, tracking of the frequency offset ensures that the estimate remains accurate, even in the presence of a fading channel or the presence of slowly-drifting frequency characteristics of the receiver or transmitter.

As an additional advantage, because estimation occurs in the phase domain, and since phase extraction is ordinarily a necessary part of differential PSK receivers, frequency offset estimation and/or tracking according to the invention can be accomplished by sharing already-existing components in the receiver.

In one aspect, the invention is a differential receiver, and methods performed thereby, which receives an RF signal that encodes a digital data payload and which outputs the digital data payload. The RF signal is processed through differential detection to obtain demodulated signals from which phase is extracted. An initial estimate of frequency offset is acquired from the extracted phase, and the estimate is applied by the receiver in compensation of frequency offset. The compensated signal is thereafter processed, such as by demodulation, decoding and bit slicing, so as to obtain the encoded digital data payload.

Preferably, the initial estimate of frequency offset is acquired according to the following equation:

$$2\pi \Delta f T = \hat{\psi} = \frac{1}{N} \sum_{n=0}^{N-1} \{angle(y(n)) - angle(y(n-L))\} \quad \text{(Equation 4)}$$

where $\Delta f$ is the frequency offset, T is time, $\hat{\psi}$ is the estimate of phase, y(n) is the demodulated PSK signal, N is the length of one training block, L represents the distance between two identical samples, and angle (.) indicates the phase extraction operation. Since phase extraction is always needed in such a receiver, it can be shared and no additional units are needed for this purpose.

According to another aspect of the invention, frequency offset is tracked in the phase domain. Tracking can occur with or without an initial acquisition of an estimate for frequency offset, and, if provided, the initial estimate of frequency offset can be obtained in the phase domain or in the time domain. Preferably, however, tracking of the frequency offset occurs after an initial estimate thereof is acquired in the phase domain. As one example of a technique for tracking the frequency offset, frequency offset tracking is performed by measuring a change in the envelope of the demodulated signal in the phase domain. Such an envelope is continuously changing, but in the presence of a frequency offset, the envelope would also tend to drift (such as by ramping) over time. Through observation of the envelope, it is possible to track frequency offset, thereby updating the estimate of frequency offset and updating the compensation for such frequency offset.

Compensation for the frequency offset can be performed either in the time domain, before differential detection, or in the phase domain, after demodulation. The choice of whether to apply compensation in the time domain or the phase domain can be made programmably selectable, for flexibility.

The invention as contemplated herein can be implemented in hardware or software, or in hybrid hardware/software systems. Accordingly, the invention comprehends hardware and computer-implemented embodiments, methods performed thereby, and computer-readable memory media storing computer executable code which is executable to carry out such methods.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE INVENTION

Embodiments of the invention will be described relative to quadrature phase shift keying (QPSK) constructions, and relative to constructions which perform both estimation and tracking of frequency offset, and both estimation and tracking offset in the phase domain. It should be understood, however, that the invention can be employed in constellation of orders that are higher than quadrature, such as an 8-PSK system or an m-ary constellation. In addition, and as indicated above, estimation and tracking are independent aspects of the invention, such that one might be used without necessarily using the other, although there are some performance advantages if both are used.

Figure 3:
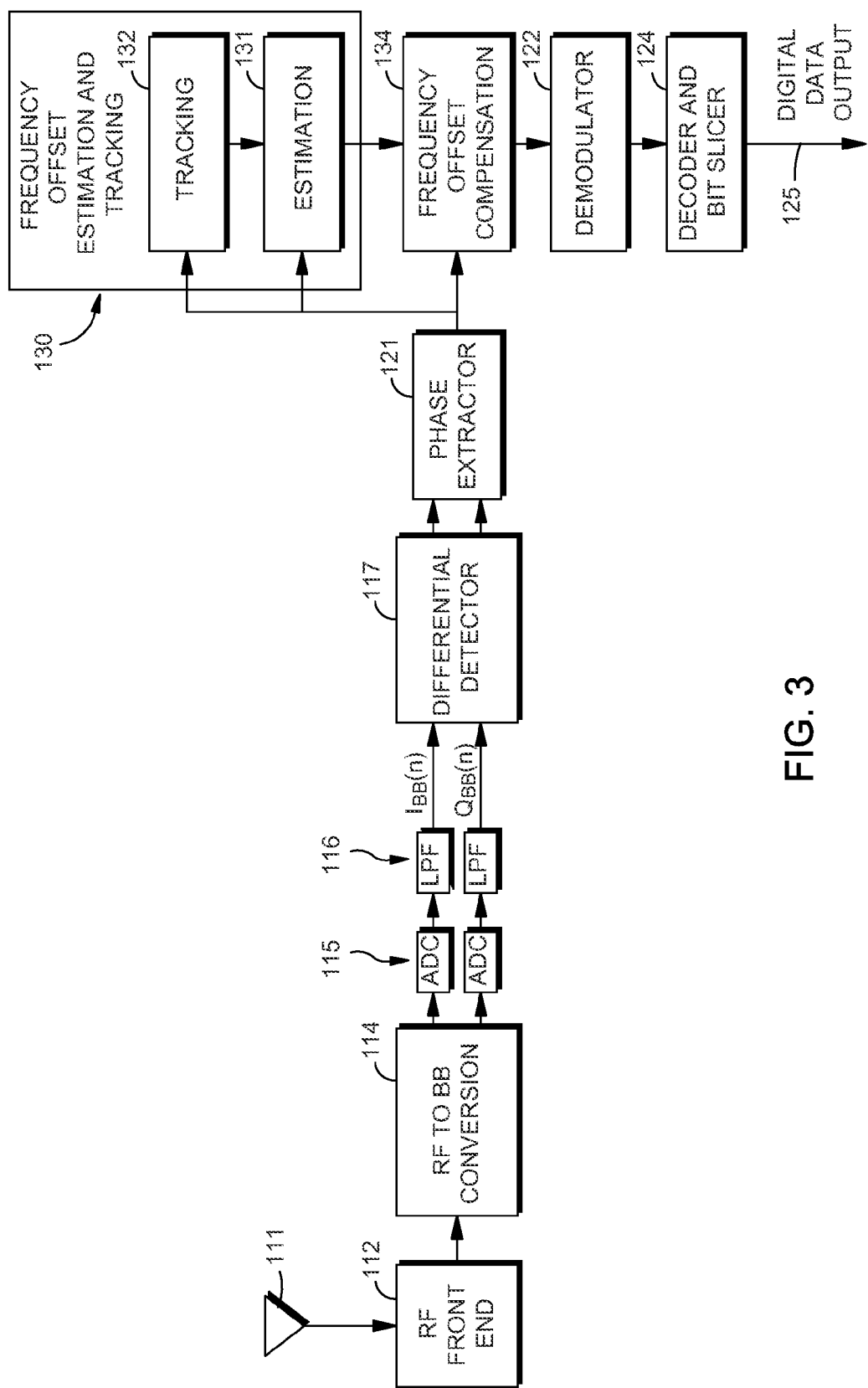
FIG. 3 is a view showing a first embodiment of the invention in which frequency offset compensation is made in the phase domain.

FIG. 3 is a block diagram showing a first embodiment of the invention, in which frequency offset estimation and tracking are both performed in the phase domain, and in which compensation therefor is also applied in the phase domain.

As shown in FIG. 3, an RF signal encoding a data payload is received by antenna 111, processed by RF front end 112, and down-converted to a baseband signal by RF-to-BB converter 114. A pair of A-to-D converters 115 convert the analog signals from RF-to-BB converter 114 into digital data, which is thereupon supplied to a pair of low-pass filters 116 and thence to differential detector 117. The differential detector 117 accepts the in-phase and quadrature phase signals ($I_{BB}$ and $Q_{BB}$, respectively) from the low-pass filters 116, and applies differential detection thereto so as to obtain corresponding demodulated PSK signals which, again, may be expressed mathematically, as follows:

$$y(n)=y_{di}(n)+j^*y_{dq}(n)=ae^{jp} \quad \text{(Equation 1)}$$

where y(n) is the nth symbol, $y_{di}$ and $y_{dq}$ are the in-phase and quadrature phase demodulated PSK signal, j is the imaginary coordinate for the complex value, and a and P represent the amplitude and phase of the receive signal, respectively.

Based on the demodulated PSK signal, phase extractor 121 extracts phase which is provided to frequency offset compensation block 134 so as to correct for frequency offsets, as will be described hereinbelow. The frequency offset-compensated signal from block 134 is provided to demodulator 122 and thereafter to decoding and bit-slicing block 124, so as to result in digital output data 125 corresponding to the digital data payload in the original RF-transmitted signal.

Frequency offset compensator 134 is provided with an estimate of frequency offset from frequency offset estimation and tracking block 130. As shown in FIG. 3, block 130 includes an estimation module 131 and a tracking module 132. The purpose of estimation module 131 is to acquire an initial estimate of frequency offset and to provide the acquired estimate to frequency offset compensation block 134. The purpose of tracking block 132 is to determine residual frequency offset errors which might remain after initial acquisition by estimation block 131, and also to track slowly drifting frequency offsets which might occur because of frequency shifts in the receiver or the transmitter, or which might be caused by fading channel. As shown in FIG. 3, the tracked frequency offset is provided from tracking block 132 to frequency offset compensator 134 via the estimation block 131, but it is possible for the tracking block 132 to bypass the estimation block 131 and provide an estimate of residual frequency offset directly to compensation block 134.

Both estimation block 131 and tracking block 132 work in the phase domain, and provide estimates of frequency offset to compensation block 134 which compensates for frequency offset in the phase domain.

Estimation block 131 acquires an initial estimate of frequency offset in accordance with the aforementioned equation 4 which is reproduced here:

$$2\pi\Delta fT = \hat{\psi} = \frac{1}{N}\sum_{n=0}^{N-1}\{angle(y(n)) - angle(y(n-L))\} \quad \text{(Equation 4)}$$

where $\Delta f$ is the frequency offset, T is time, $\hat{\omega}$ is the estimate of phase, y(n) is the demodulated PSK signal, N is the length of one training block, L represents the distance between two identical samples, and angle (.) indicates the phase extraction operation. Since phase extraction is always needed in such a DQPSK receiver, it can be shared from phase extraction block 121 and no additional units are needed for this purpose.

It will be understood from Equation 4 that estimation block 131 acquires its initial estimate of frequency offset in a manner that is advantageous relative to conventional systems. For example, because the estimate of frequency offset is acquired in the phase domain, there is ordinarily no need to perform complex-value multiplications and additions as might be needed in conventional systems as represented by Equation 2 above. This lower level of computational complexity translates into smaller chip-area and power consumptions relative to conventional systems. Further, the number of pilots, N, can typically be much less than that used above in Equation 2, since the blind tracking loop followed by tracking block 132 (described below) can further decrease any residual estimation error. Thus, transmission efficiency is further improved using fewer pilots, which translates into a smaller preamble and a larger data payload. Finally, because a differential receiver uses neighboring symbols for its differential detection, the block distance L in Equation 1 is generally equal to precisely 1. Due to this, the estimation range for the frequency offset is extended up to half the signal bandwidth, thus assuring a much higher estimation range relative to conventional systems.

Figure 1:
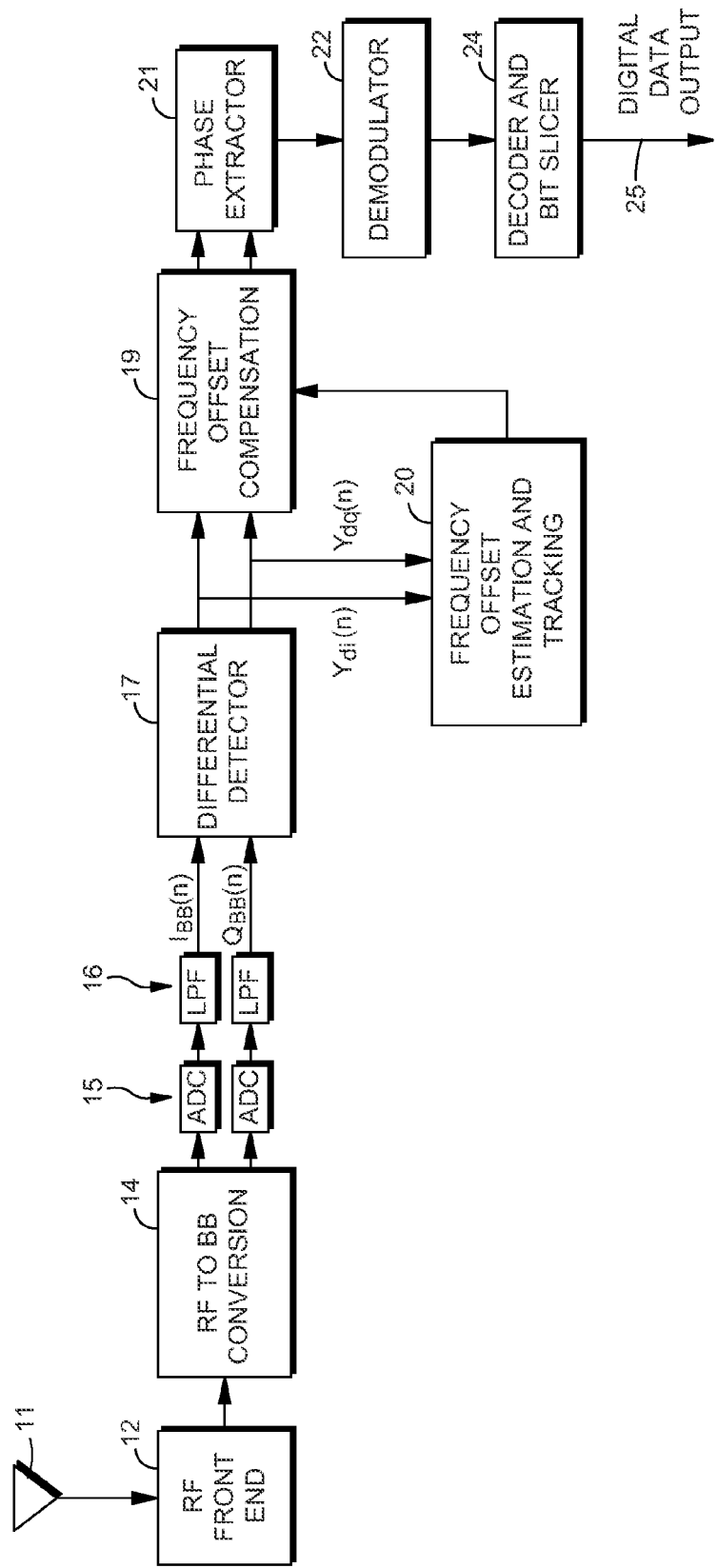
FIG. 1 is conventional DQPSK receiver.
Figure 2:
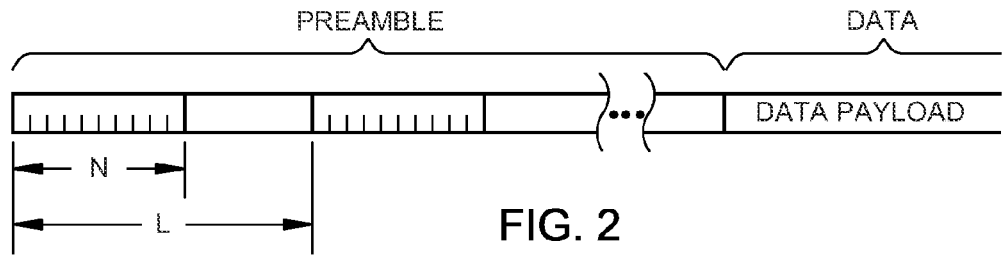
FIG. 2 is a view for explaining the components of an RF transmission which includes a preamble and a digital data payload.
Figure 4:
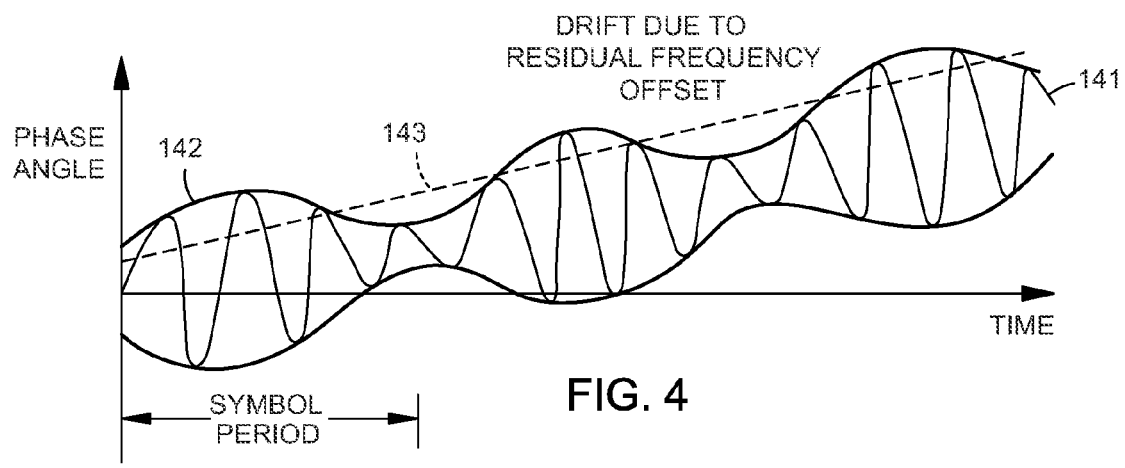
FIG. 4 is a view showing phase angle drift in the presence of residual frequency offset.

After acquisition of an initial estimate for frequency offset by block 131, there is ordinarily a need to track frequency offset, for residual errors in the estimate of the frequency offset, and for frequency offset drifts. FIG. 4 illustrates this situation. FIG. 4 is a representative graph of phase angle of signal 141 versus time over a few symbol periods, with an envelope 142 superimposed on the maximum signals. As seen in FIG. 4, in the presence of residual frequency offset, or in the presence of a drifting frequency offset, there will be a slow and undesirable drift in phase angle, which is shown by dashed line 143 and which eventually will cause bit errors.

Figure 5:
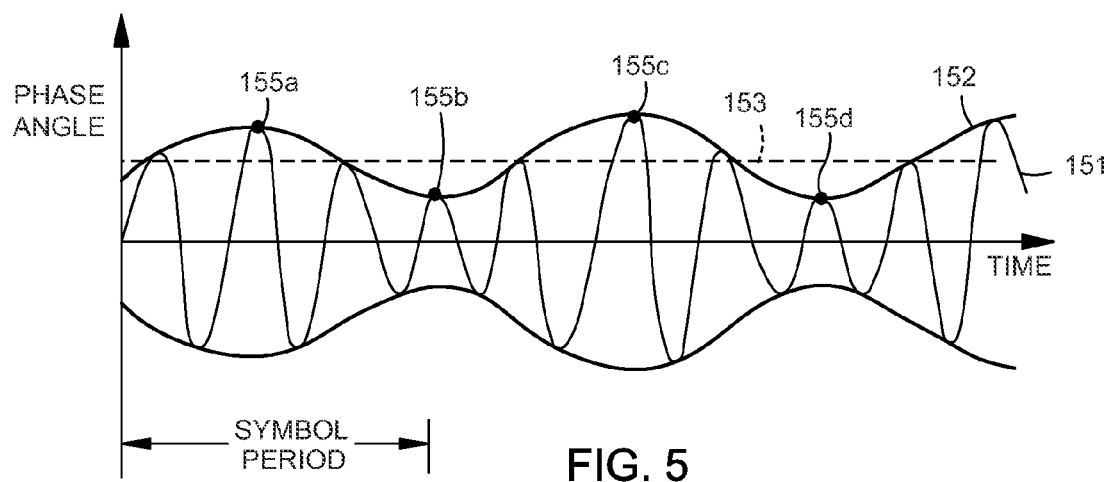
FIG. 5 is a view for explaining signal sampling in accordance with frequency offset tracking of the invention.

FIG. 5 shows the operation of tracking block 132, which tracks these residual frequency offset errors so as to result in a stabilized estimate of frequency offset, even in the presence of residual errors from the initial acquisition, and even in the presence of drift in frequency offset. Like FIG. 4, FIG. 5 shows a representative graph of phase angle of signal 151 versus time over a few symbol periods, with an envelope 152 superimposed on the maximum signals. In FIG. 5, tracking block 132 observes the phase envelope of the phase signal so as to ensure that the phase envelope does not exhibit drift caused by frequency offset error. As shown in FIG. 5, tracking block 132 samples the phase signal at points corresponding to maximum and minimum deviations of the envelope. These points are depicted as 155a and 155c for maximum deviation of the envelope, and 155b and 155d for minimum deviations of the envelope. For this purpose, it is ordinarily necessary for tracking block 132 to be provided with information on symbol timing, but the signal path for this information is not shown in the figures herein in the interests of simplicity. Tracking block 132 obtains the average of the maximum and minimum deviations in the phase envelope, and the average corresponds to residual frequency offset and frequency drift. This information is updated to the existing frequency offset estimate in estimation block 131, which thereupon provides the updated estimate to frequency offset compensation block 134.

The foregoing arrangement is particularly advantageous in systems exhibiting a high SNR, since the minimum and maximum deviation will not be affected significantly by white noise. It is therefore able to track drift very accurately and quickly. One disadvantage, however, is that there is a need to search for maximum and minimum deviations of the phase.

Accordingly, it is also possible for tracking block 132 to sample the positive and negative phases corresponding to the clocked sampling phases for each symbol, thereby avoiding the cost for searching for the minimum and maximum deviations. The sum of these two phases provides a residual frequency offset and frequency drift, and as before, is updated to the existing frequency offset estimate through estimation block 131 and thence to frequency offset compensation block 134.

Figure 6:
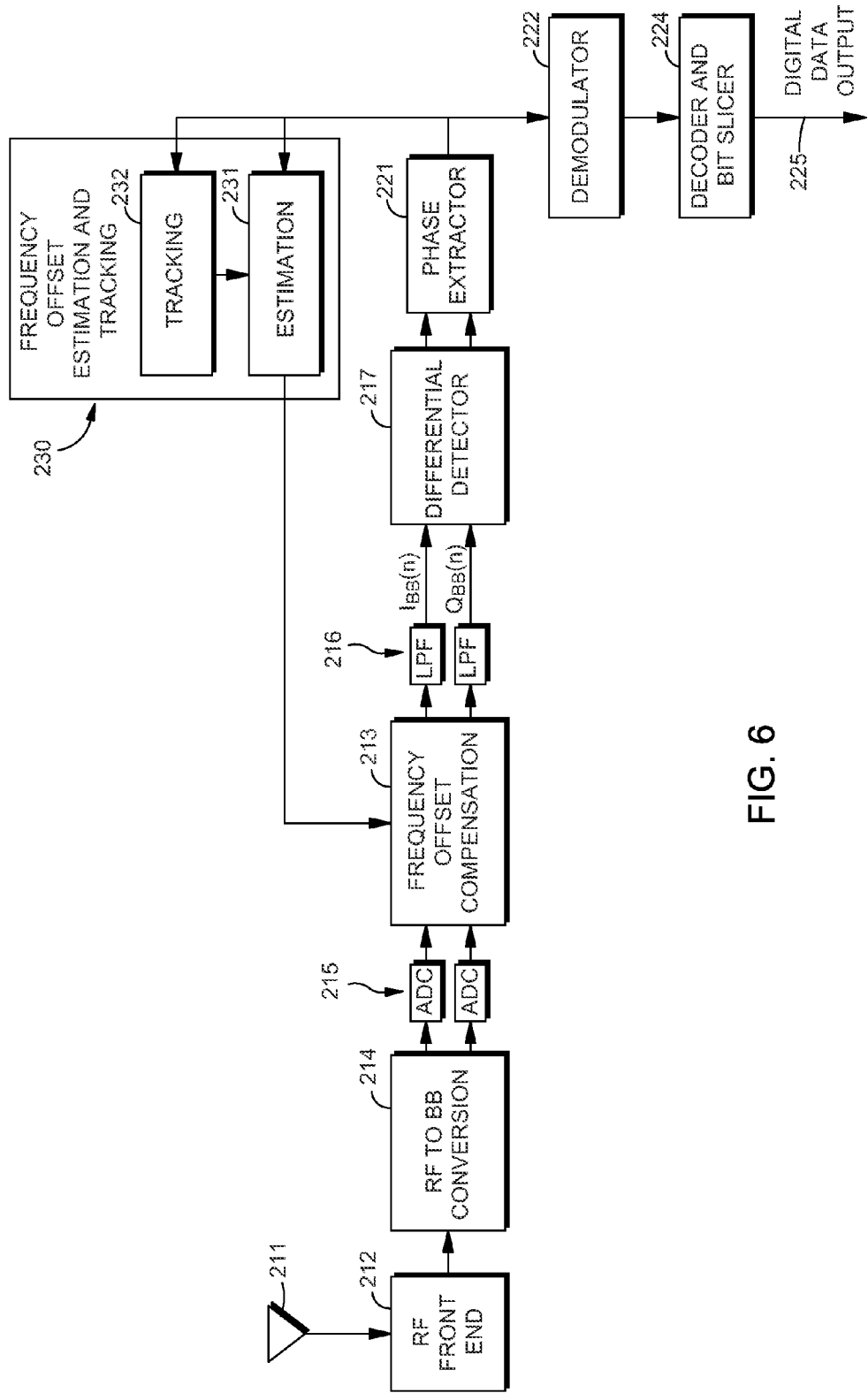
FIG. 6 is a view showing a second embodiment of the invention, in which frequency offset compensation is made in the time domain.

FIG. 6 is a view showing a second embodiment of the invention, in which frequency offset estimation and tracking is performed in the phase domain, as before, but in which compensation is performed in the time domain. Reference numerals shown in FIG. 6 are similar to those in FIG. 3 where functionality is also similar, and a description thereof is omitted.

Referring to FIG. 6, frequency offset compensation block 213 performs frequency offset compensation in the time domain. Compensation is performed based on an estimate obtained by frequency offset estimation and tracking block 230, which obtains its estimate of frequency offset in the phase domain in a manner similar to that of block 130 of the first embodiment.

Figure 7:
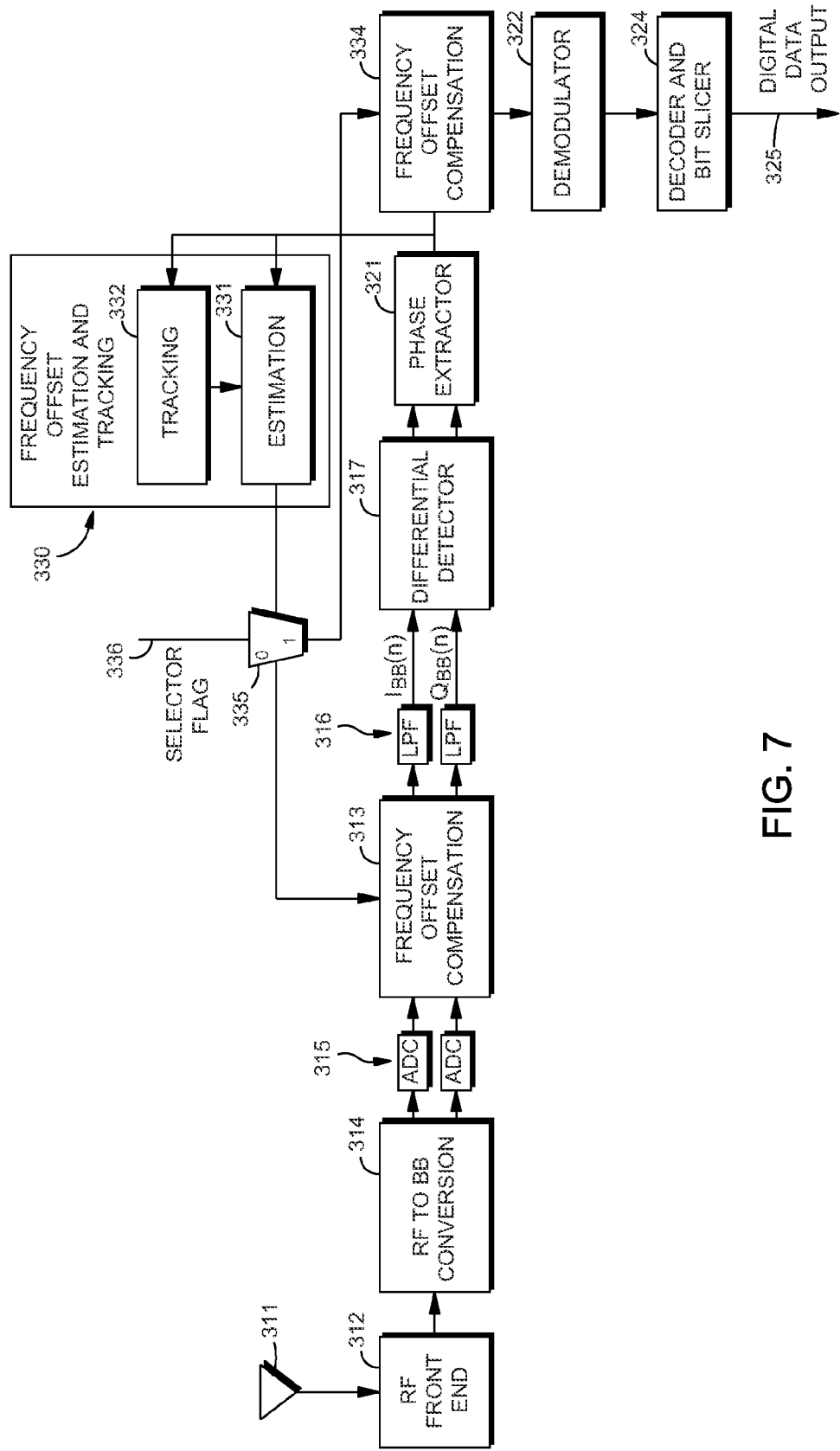
FIG. 7 is a view of a third embodiment of the invention, in which there is a programmable selection for frequency offset compensation in either the time domain or the phase domain.

A third embodiment of the invention is shown in FIG. 7 in which there is a programmable selection as to whether frequency offset compensation is performed in the phase domain or in the time domain. Like-numbered reference numerals are used in FIG. 7 relative to FIGS. 3 and 6, for similarly-functioning blocks.

In FIG. 7, programmable selector 335 provides the estimate of frequency offset either to a time domain-based compensator 313 or to a phase domain-based compensator 334. Selection of the destination is programmable in accordance with selector flag 336.

Figure 8:
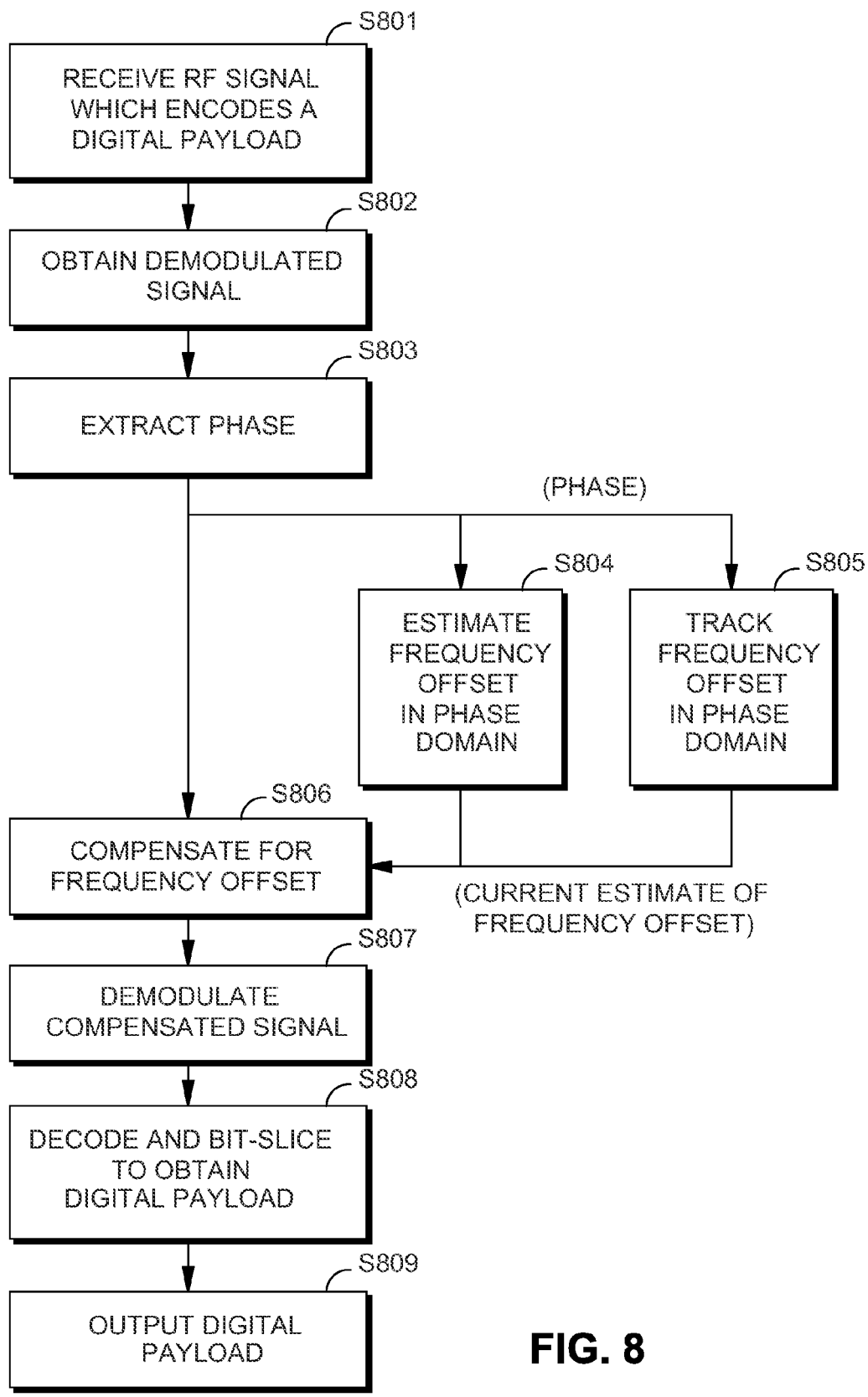
FIG. 8 is a generalized flow diagram showing methods performed by the invention herein.

FIG. 8 is a generalized flow diagram showing methods performed by the invention herein. The process steps shown in FIG. 8 may be carried out by a hardware apparatus embodying the invention, or they may be carried out by software embodying the invention, or in hybrid hardware/software systems. In the case of software, the software is ordinarily stored on computer-readable memory media such as ROM or EEPROM which stores computer-executable code which, when executed by a microprocessor or equivalent CPU is executed to carry out such methods.

In step S801, an RF signal is received which encodes a digital payload. The RF signal is processed so as to obtain a demodulated signal (step S802), such as by pre-processing the RF signal to convert the RF signal to an intermediate or broadband signal and thereafter to apply differential detection so as to obtain the demodulated signal. Phase is extracted from the demodulated signal (step S803), and in the phase domain, using the extracted phase, an estimate is made of frequency offset (step S804) and/or frequency offset is tracked (step S805). A current estimate of frequency offset is then applied in step S806 so as to compensate the signal for frequency offset.

It should be understood in accordance with the above-described embodiments of the invention that compensation for frequency offset can be performed in the phase domain (as depicted in FIG. 8) or can be performed in the time domain. In such a circumstance, the ordering of steps S803 and S806 is reversed, such that there is a compensation for frequency offset before there is an extraction of phase. Also in accordance with this latter case, the current estimation of frequency offset is performed through a feed-back arrangement, rather than the feed-forward arrangement of FIG. 8.

Continuing in FIG. 8, steps S807 through S809 perform post-processing in order to process the compensated signal to obtain the digital data payload. Specifically, step S807 demodulates the compensated signal to obtain a demodulated signal that also is compensated for frequency offset. Step S808 decodes the compensated signal and also performs bit-slicing operation so as to obtain the digital payload, which is thereafter output in step S809.

FIGS. 9 through 13 show additional embodiments of the invention when implemented as part of a wireless LAN (WLAN) in particular applications of WLAN.

Figure 9:
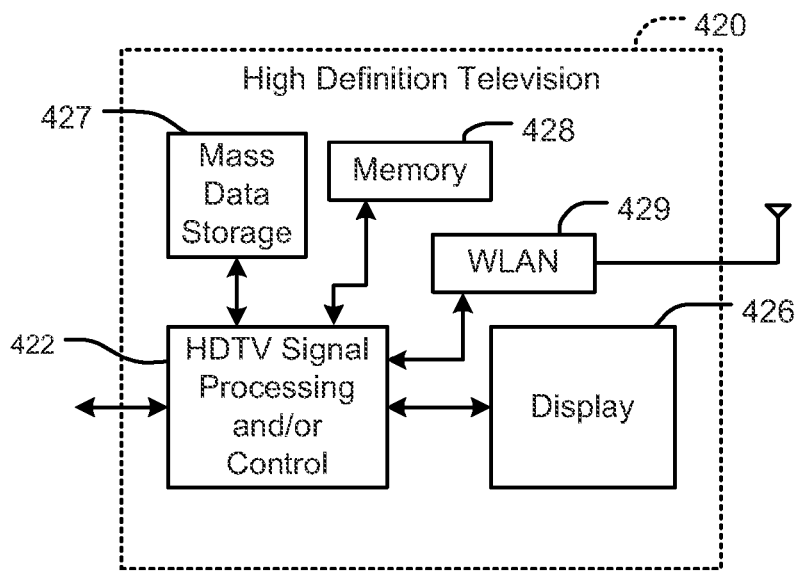
FIG. 9 illustrates an additional embodiment of the invention, embodied in a high definition television (HDTV) 420.

Referring now to FIG. 9, the present invention may be embodied in a high definition television (HDTV) 420. The present invention may implement either or both signal processing and/or control circuits, which are generally identified in FIG. 9 at 422, a WLAN interface and/or mass data storage of the HDTV 420. HDTV 420 receives HDTV input signals in either a wired or wireless format and generates HDTV output signals for a display 426. In some implementations, signal processing circuit and/or control circuit 422 and/or other circuits (not shown) of HDTV 420 may process data, perform coding and/or encryption, perform calculations, format data and/or perform any other type of HDTV processing that may be required.

HDTV 420 may communicate with mass data storage 427 that stores data in a nonvolatile manner such as optical and/or magnetic storage devices. The HDD may be a mini HDD that includes one or more platters having a diameter that is smaller than approximately 1.8". HDTV 420 may be connected to memory 428 such as RAM, ROM, low latency nonvolatile memory such as flash memory and/or other suitable electronic data storage. HDTV 420 also may support connections with a WLAN via a WLAN network interface 429.

Figure 10:
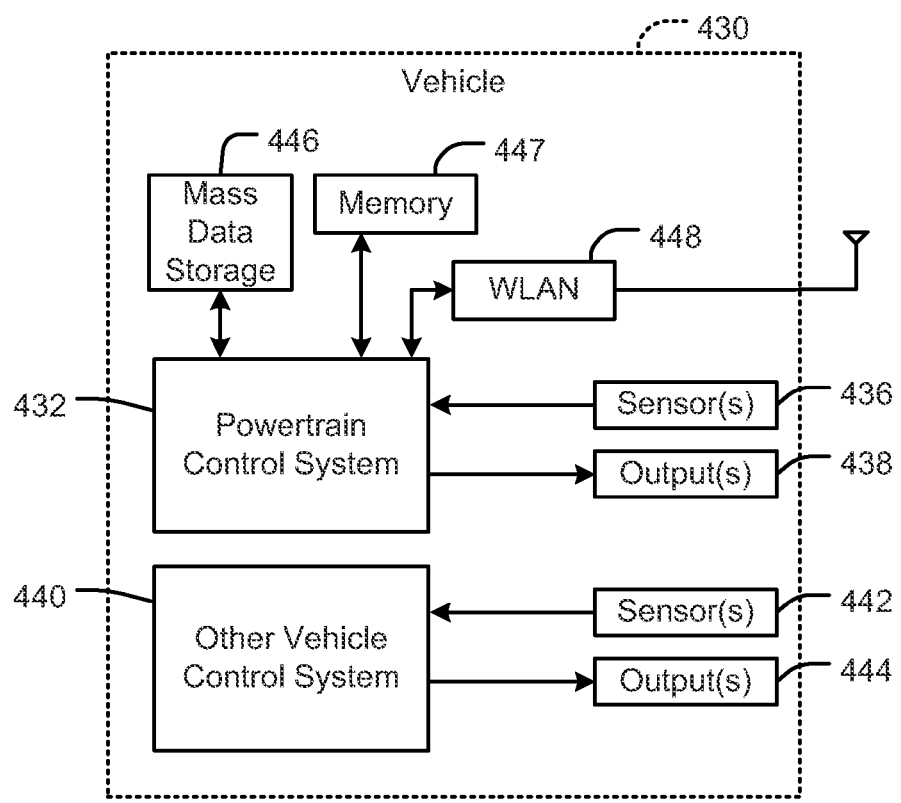
FIG. 10 illustrates an additional embodiment of the invention, implementing a control system of a vehicle 430, a WLAN interface and/or mass data storage of the vehicle control system.

Referring now to FIG. 10, the present invention implements a control system of a vehicle 430, a WLAN interface and/or mass data storage of the vehicle control system. In some implementations, the present invention implements a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 440 of vehicle 430. Control system 440 may likewise receive signals from input sensors 442 and/or output control signals to one or more output devices 444. In some implementations, control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 432 may communicate with mass data storage 446 that stores data in a nonvolatile manner. Mass data storage 446 may include optical and/or magnetic storage devices for example hard disk drives HDD and/or DVDs. The HDD may be a mini HDD that includes one or more platters having a diameter that is smaller than approximately 1.8". Powertrain control system 432 may be connected to memory 447 such as RAM, ROM, low latency nonvolatile memory such as flash memory and/or other suitable electronic data storage. Powertrain control system 432 also may support connections with a WLAN via a WLAN network interface 448. The control system 440 may also include mass data storage, memory and/or a WLAN interface (all not shown).

Figure 11:
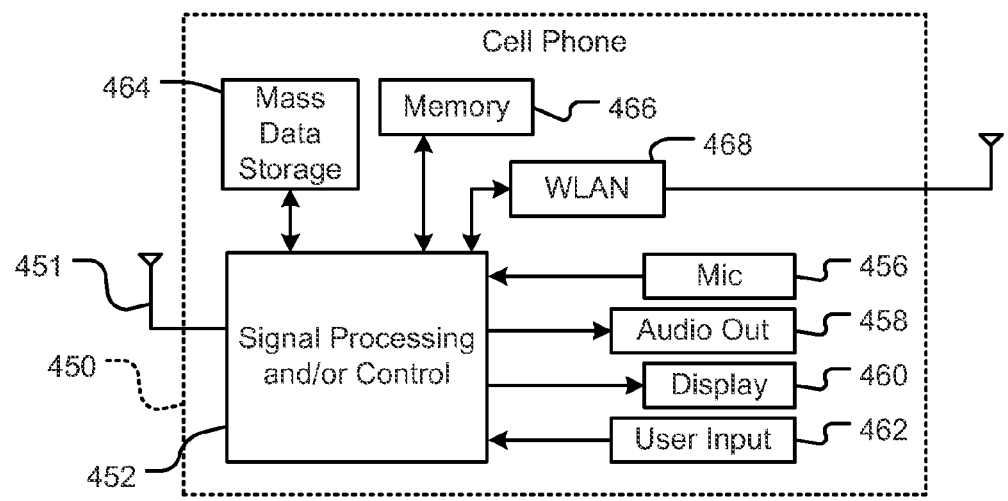
FIG. 11 illustrates an additional embodiment of the invention, embodied in a cellular phone 450 that may include a cellular antenna 451.

Referring now to FIG. 11, the present invention may be embodied in a cellular phone 450 that may include a cellular antenna 451. The present invention may implement either or both signal processing and/or control circuits, which are generally identified in FIG. 11 at 452, a WLAN interface and/or mass data storage of the cellular phone 450. In some implementations, cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in cellular phone 450 may process data, perform coding and/or encryption, perform calculations, format data and/or perform other cellular phone functions.

Cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". Cellular phone 450 may be connected to memory 466 such as RAM, ROM, low latency nonvolatile memory such as flash memory and/or other suitable electronic data storage. Cellular phone 450 also may support connections with a WLAN via a WLAN network interface 468.

Figure 12:
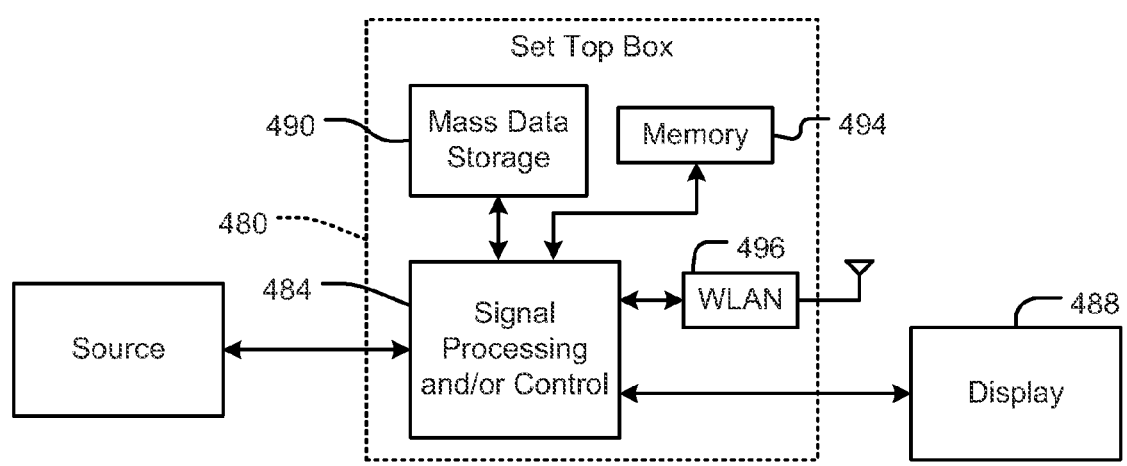
FIG. 12 illustrates an additional embodiment of the invention, embodied in a set top box 480.

Referring now to FIG. 12, the present invention may be embodied in a set top box 480. The present invention may implement either or both signal processing and/or control circuits, which are generally identified in FIG. 12 at 484, a WLAN interface and/or mass data storage of the set top box 480. Set top box 480 receives signals from a source such as a broadband source and outputs standard and/or high definition audio/video signals suitable for a display 488 such as a television and/or monitor and/or other video and/or audio output devices. Signal processing and/or control circuits 484 and/or other circuits (not shown) of the set top box 480 may process data, perform coding and/or encryption, perform calculations, format data and/or perform any other set top box function.

Set top box 480 may communicate with mass data storage 490 that stores data in a nonvolatile manner. Mass data storage 490 may include optical and/or magnetic storage devices for example hard disk drives HDD and/or DVDs. The HDD may be a mini HDD that includes one or more platters having a diameter that is smaller than approximately 1.8". Set top box 480 may be connected to memory 494 such as RAM, ROM, low latency nonvolatile memory such as flash memory and/or other suitable electronic data storage. Set top box 480 also may support connections with a WLAN via a WLAN network interface 496.

Figure 13:
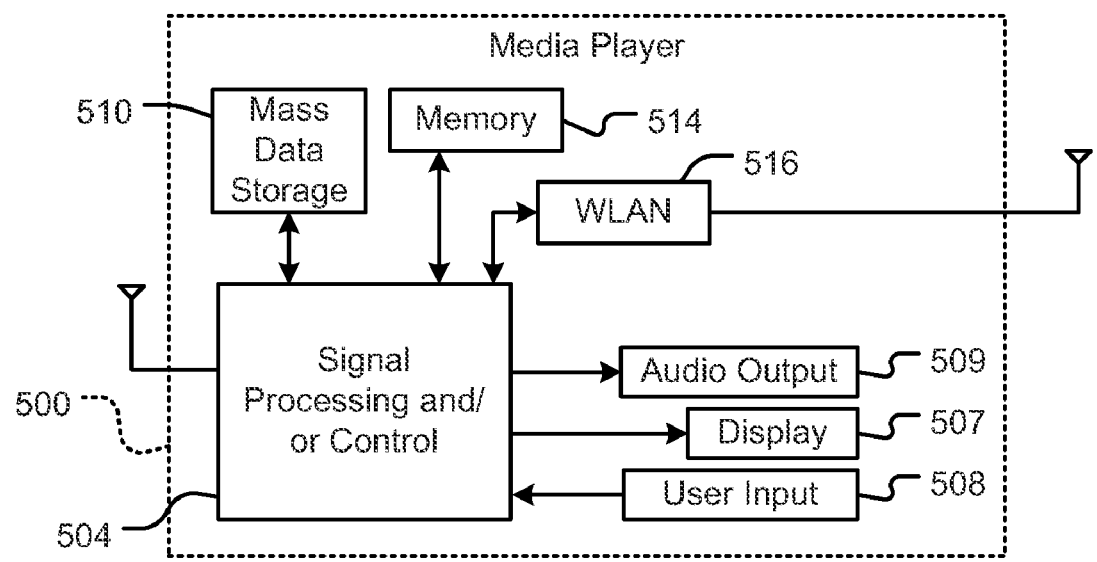
FIG. 13 illustrates an additional embodiment of the invention, embodied in a media player 500.

Referring now to FIG. 13, the present invention may be embodied in a media player 500. The present invention may implement either or both signal processing and/or control circuits, which are generally identified in FIG. 13 at 504, a WLAN interface and/or mass data storage of the media player 500. In some implementations, media player 500 includes a display 507 and/or a user input 508 such as a keypad, touchpad and the like. In some implementations, media player 500 may employ a graphical user interface (GUI) that typically employs menus, drop down menus, icons and/or a point-and-click interface via display 507 and/or user input 508. Media player 500 further includes an audio output 509 such as a speaker and/or audio output jack. Signal processing and/or control circuits 504 and/or other circuits (not shown) of media player 500 may process data, perform coding and/or encryption, perform calculations, format data and/or perform any other media player function.

Media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". Media player 500 may be connected to memory 514 such as RAM, ROM, low latency nonvolatile memory such as flash memory and/or other suitable electronic data storage. Media player 500 also may support connections with a WLAN via a WLAN network interface 516. Still other implementations in addition to those described above are contemplated The invention has been described above with respect to particular illustrative embodiments. It is understood that the invention is not limited to the above-described embodiments and that various changes and modifications may be made by those skilled in the relevant art without departing from the spirit and scope of the invention.

What is claimed is:

1. A differential receiver comprising:
a converter configured to
down-convert the radio frequency signal to a baseband signal, and
extract each of (i) an analog in-phase signal and (ii) an analog quadrature phase signal from the baseband signal;
an analog-to-digital converter configured to (i) convert the analog in-phase signal into a digital in-phase signal and (ii) convert the analog quadrature phase signal into a digital quadrature phase signal;
a detector configured to obtain a demodulated phase shift keying (PSK) signal based on each of the digital in-phase signal and the digital quadrature phase signal;
a phase extractor configured to extract a phase based on the demodulated PSK signal;
a frequency offset estimation module configured to, in the phase domain, acquire an estimate of frequency offset contained in the demodulated PSK signal based on the phase extracted from the demodulated PSK signal;
a first frequency offset compensation module configured to compensate, in the phase domain, for the frequency offset contained in the demodulated PSK signal based on the estimate of frequency offset acquired by the frequency offset estimation module;
a second frequency offset compensation module configured to compensate, in the time domain, for the frequency offset contained in the demodulated PSK signal based on the estimate of the frequency offset acquired by the frequency offset estimation module; and
a programmable selector to provide the estimate of the frequency offset acquired by the frequency offset estimation module to either (i) the first frequency offset compensation module or (ii) the second frequency offset compensation module.

2. The differential receiver of claim 1, wherein the estimate of frequency offset is acquired by the frequency offset estimation module according to at least an approximation of the following equation:

$$2\pi \Delta fT = \hat{\psi} = \frac{1}{N}\sum_{n=0}^{N-1}\{angle(y(n)) - angle(y(n-L))\}$$

where $\Delta f$ is the frequency offset, T is time, $\hat{\psi}$ is the estimate of phase, y(n) is the demodulated PSK signal, N is the length of one training block, L represents the distance between two identical samples, and angle (.) indicates the phase extraction operation.

3. The differential receiver of claim 1, further comprising:
a frequency offset tracking module configured to track frequency offset;

wherein the estimate of frequency offset is updated based on the tracked frequency offset.

4. The differential receiver of claim 3, wherein the frequency offset tracking module is configured to track the frequency offset in the phase domain.

5. The differential receiver of claim 4, wherein the frequency offset tracking module is configured to track the frequency offset by measuring a change in an envelope of the PSK demodulated signal.

6. The differential receiver of claim 5, wherein the frequency offset tracking module is configured to:
sample the envelope at points corresponding to maximum and minimum deviations of the envelope; and
track the frequency offset by averaging the maximum and minimum deviations.

7. The differential receiver of claim 5, wherein the frequency offset tracking module is configured to:
sample positive and negative phases corresponding to clocked sampling phases for each symbol; and
track the frequency offset by summing the positive and negative phases.

8. The differential receiver of claim 1, further comprising:
a post-processing arrangement configured to process the demodulated PSK signal after compensation so as to obtain a digital data payload.

9. The differential receiver of claim 8, wherein the post-processing arrangement comprises a demodulator, a decoder, and a bit-slicer.

10. The differential receiver of claim 1, wherein the differential receiver is implemented in a device selected from the group consisting of a high definition television, a control system of a vehicle, a cellular phone, a set top box, and a media player.

11. A method of compensating a radio frequency signal for frequency offset, the method comprising:
down-converting the radio frequency signal to a baseband signal;
extracting each of (i) an analog in-phase signal and (ii) an analog quadrature phase signal from the baseband signal;
converting the analog in-phase signal into a digital in-phase signal;
converting the analog quadrature phase signal into a digital quadrature phase signal;
obtaining a demodulated phase shift keying (PSK) signal based on each of the digital in-phase signal and the digital quadrature phase signal;
extracting a phase based on the demodulated PSK signal;
estimating a frequency offset contained in the demodulated PSK signal based on the phase extracted from the demodulated PSK signal to thereby provide an estimated frequency offset;
providing a first frequency offset compensation module that is configured to compensate, in a phase domain, for the frequency offset contained in the demodulated PSK signal based on the estimated frequency offset;
providing a second frequency offset compensation module that is configured to compensate, in a time domain, for the frequency offset contained in the demodulated PSK signal based on the estimated frequency offset;
selecting one of the first frequency offset compensation module and the second frequency offset compensation module; and
providing the estimated frequency offset to the selected one of the first frequency offset compensation module and the second frequency offset compensation module.

12. The method of claim 11, wherein estimating a frequency offset comprises estimating a frequency offset according to at least an approximation of the following equation:

$$2\pi \Delta fT = \hat{\psi} = \frac{1}{N} \sum_{n=0}^{N-1} \{angle(y(n)) - angle(y(n-L))\}$$

where $\Delta f$ is the frequency offset, T is time, $\hat{\psi}$ is the estimate of phase, y(n) is the demodulated PSK signal, N is the length of one training block, L represents the distance between two identical samples, and angle (.) indicates the phase extraction operation.

13. The method of claim 11, further comprising:
tracking frequency offset in the demodulated PSK signal; and
updating the estimated frequency offset based on the tracked frequency offset.

14. The method of claim 13, wherein tracking the frequency offset in the demodulated PSK signal comprises tracking the frequency offset in the phase domain.

15. The method of claim 14, wherein tracking the frequency offset in the demodulated PSK signal comprises tracking the frequency offset by measuring a change in an envelope of the demodulated PSK signal.

16. The method of claim 15, wherein tracking the frequency offset by measuring a change in an envelope of the demodulated PSK signal comprises:
sampling the envelope at points corresponding to maximum and minimum deviations of the envelope; and
tracking the frequency offset by averaging the maximum and minimum deviations.

17. The method of claim 15, wherein tracking the frequency offset by measuring a change in an envelope of the demodulated PSK signal comprises:
sampling positive and negative phases corresponding to clocked sampling phases for each symbol; and
tracking the frequency offset by summing the positive and negative phases.

18. The method of claim 11, further comprising:
processing the demodulated PSK signal after compensation so as to obtain a digital data payload.

* * * * *